United States Patent
Ku et al.

(10) Patent No.: US 7,306,996 B2
(45) Date of Patent: Dec. 11, 2007

(54) METHODS OF FABRICATING A SEMICONDUCTOR DEVICE HAVING A METAL GATE PATTERN

(75) Inventors: Ja-Hum Ku, Sungnam (KR); Chang-Won Lee, Seoul (KR); Seong-Jun Heo, Seoul (KR); Sun-Pil Youn, Seoul (KR); Sung-Man Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/498,197

(22) Filed: Aug. 3, 2006

(65) Prior Publication Data

US 2006/0270205 A1    Nov. 30, 2006

Related U.S. Application Data

(63) Continuation of application No. 10/665,122, filed on Sep. 22, 2003, now Pat. No. 7,109,104.

(30) Foreign Application Priority Data

Sep. 19, 2002    (KR) ............................ 2002-57456

(51) Int. Cl.
*H01L 21/336* (2006.01)
*H01L 21/3205* (2006.01)
*H01L 21/4763* (2006.01)
*H01L 21/44* (2006.01)

(52) U.S. Cl. .................. 438/299; 438/595; 438/592; 438/303; 438/653; 438/656; 257/E21.626; 257/E21.64; 257/E21.623; 257/E21.637; 257/E21.421; 257/E21.455

(58) Field of Classification Search ................ 438/592, 438/595, 299, 303, 656; 257/E21.626, E21.64, 257/E21.623, E21.637, E21.421, E21.455
See application file for complete search history.

(56) References Cited

U.S. PATENT DOCUMENTS

4,505,028 A    3/1985    Kobayashi et al.

(Continued)

FOREIGN PATENT DOCUMENTS

CN    1263357 A    12/1998

(Continued)

OTHER PUBLICATIONS

Chinese Office Action dated Oct. 27, 2006.

*Primary Examiner*—Walter L Lindsay, Jr.
(74) *Attorney, Agent, or Firm*—Harness, Dickey & Pierce

(57) ABSTRACT

A method of fabricating a semiconductor device having a metal gate pattern is provided in which capping layers are used to control the relative oxidation rates of portions of the metal gate pattern during a oxidation process. The capping layer may be a multilayer structure and may be etched to form insulating spacers on the sidewalls of the metal gate pattern. The capping layer(s) allow the use of a selective oxidation process, which may be a wet oxidation process utilizing partial pressures of both $H_2O$ and $H_2$ in an $H_2$-rich atmosphere, to oxidize portions of the substrate and metal gate pattern while suppressing the oxidation of metal layers that may be included in the metal gate pattern. This allows etch damage to the silicon substrate and edges of the metal gate pattern to be reduced while substantially maintaining the original thickness of the gate insulating layer and the conductivity of the metal layer(s).

21 Claims, 7 Drawing Sheets

U.S. PATENT DOCUMENTS 6,245,605 B1  6/2001  Hwang et al.
6,277,722 B1  8/2001  Lee et al.

FOREIGN PATENT DOCUMENTS

EP   1 020 922 A2   7/2000
KR   1997-017969   4/1997

METHODS OF FABRICATING A SEMICONDUCTOR DEVICE HAVING A METAL GATE PATTERN

CROSS REFERENCE TO RELATED APPLICATIONS

This application is a continuation of Application No. 10/665,122 filed on Sep. 22, 2003 now U.S. Pat. No. 7,109,104, and from which priority is claimed under 35 U.S.C. §120. This application also claims priority from Korean Patent Application No. 2002-57456 filed on Sep. 19, 2002, in the Korean Intellectual Property Office under 35 U.S.C. §119. The entire contents of both of these applications are incorporated herein by reference.

BACKGROUND OF THE INVENTION

1. Field of the Invention

The present invention relates generally to methods of fabricating semiconductor devices having metal gate patterns, and more particularly to a method of fabricating a semiconductor that includes selective oxidation to reduce damage to the metal gate pattern caused by dry etching.

2. Description of the Related Art

Due to a continuing interest in increasing the integration density of semiconductor devices, the dimensions of various structural elements such as capacitors and gate electrodes utilized to form such semiconductor devices also tend to be reduced. Because of the increase in the integration density, materials having a low resistivity have been used to decrease signal delay. For example, metal gates which use a metallic material having a low resistivity have been utilized for lowering the sheet resistance of a gate and lowering the height of a gate stack. These studies have led to the development of metal gates incorporating a tungsten/tungsten nitride/polysilicon stack structure.

Forming a metal gate stack may include forming a gate insulating layer on a silicon substrate, sequentially stacking a polysilicon layer, a tungsten nitride layer, a tungsten layer, and a gate mask layer, forming an etch mask using a photolithographic process, and performing a dry etching process. However, the surface of the silicon substrate and the sidewalls of the metal gate pattern exposed to the dry etching process may be damaged by the dry etching process. An oxidation process (e.g., a "gate polysilicon reoxidation process") may be performed to correct damage caused by the dry etching process. One example of a conventional gate polysilicon reoxidation process is a rapid thermal process performed in an atmosphere of a gas mixture of $O_2$ gas and $NF_3$ gas, such as is described in U.S. Pat. No. 5,672,525, the contents of which are incorporated by reference in their entirety.

The gate polysilicon reoxidation process may be carried out using a dry oxidation process. In a dry oxidation process, however, the exposed surface of a tungsten layer, which may be a metal layer included in the metal gate pattern, may be oxidized by the dry oxidation process. This oxidation of the tungsten layer may result in a reduction in the effective sectional area of the gate. As a result, the resistance of a gate line (e.g., a conductive line), may be increased, which may cause a delay of a signal transmission. Further, the oxidation of the tungsten layer may cause the metal gate pattern to have a poor vertical profile.

FIG. 1 is a graph illustrating the thickness of a gate oxide layer with respect to the gate length after a conventional selective oxidation was performed. Referring to FIG. 1, selective oxidation was performed on a gate pattern that included a gate oxide layer and a polysilicon layer formed on a silicon substrate. The selective oxidation was performed in a rapid thermal process (RTP) apparatus and a furnace apparatus under various process conditions. As shown in FIG. 1, when the gate length was 180 nm or more, the gate oxide layer had a thickness of about 55 Å at approximately the center of the gate pattern. When the gate length was 90 nm or less, the gate oxide layer had a thickness of from about 85 to about 150 Å. As reflected in these results, when the gate length is small, the selective oxidation process may result in a dramatic and undesirable increase in the thickness of the gate oxide layer due to a "bird's beak" effect.

Selective oxidation using a partial pressure ratio of $H_2O$ and $H_2$ in an $H_2$-rich wet oxidation process may oxidize a polysilicon layer and a silicon substrate and may reduce the oxidation of the metal layers included in the metal gate pattern. As reflected in Table 1, below, both the oxidation rates for silicon and polysilicon and the ratios of those rates can vary depending on the particular oxidation process employed. Table 1 provides the results obtained by measuring the thicknesses of oxide layers formed on the surfaces of a silicon substrate and a polysilicon layer, after performing both a conventional dry oxidation and selective oxidation processes, respectively.

TABLE 1

| Classification | Dry oxidation 850° C., 50 Å | Selective oxidation 850° C., 50 Å | Selective oxidation 850° C., 30 Å |
|---|---|---|---|
| Thickness T1 of oxide layer on silicon substrate | 63.14 Å | 50.53 Å | 30.86 Å |
| Thickness T2 of oxide layer on polysilicon layer | 144.84 Å | 158.59 Å | 93.16 Å |
| T2/T1 | 2.29 | 3.14 | 3.02 |

As shown Table 1, the silicon substrate and the polysilicon layer had an original thickness of 50 Å. Each of the silicon substrate and the polysilicon layer were oxidized by dry oxidation and selective oxidation at 850° C. When the dry oxidation was performed, the oxide layer formed on the polysilicon layer was approximately 2.2 times as thick as the oxide layer formed on the silicon substrate. By comparison, when selective oxidation was performed, the oxide formed on the polysilicon layer was approximately 3.1 times as thick as the oxide layer formed on the silicon substrate.

When the silicon substrate and the polysilicon layer had an original thickness of 30 Å and selective oxidation was performed, the oxide layer formed on the polysilicon layer was approximately 3.0 times as thick as that formed on the silicon substrate after wet selective oxidation (e.g., the oxidation rate (T2/T1) of the polysilicon layer was approximately 3.0 times as high as that of the silicon substrate.

FIG. 2A is a photograph illustrating the thickness of a gate oxide layer at the edge of a gate pattern (with no capping layer) according to a conventional selective oxidation process. FIG. 2B is a photograph illustrating the thickness of the gate oxide layer at the center of the gate pattern shown in FIG. 2A. Prior to conducting the selective oxidation process, the gate oxide layer had a thickness of approximately 55 Å. As shown in FIG. 2A, after the selective oxidation process, the gate oxide layer had a thickness of approximately 98 Å at the edge of the gate pattern and a thickness of approximately 90 Å at the center of the gate pattern. Thus, the thickness of the gate oxide layer, both at the edge of the gate pattern and at the center of the gate pattern, was increased. As a result, the gate oxide layer will have an increased likelihood of exhibiting punch-through failures.

Although conventional selective oxidation may correct damage caused by etching when a metal gate is used, dry selective oxidation fails to control the thickness of the gate oxide layer, and poses a particular problem for designs utilizing smaller gate lengths. Also, since the increased gate oxide layer is typically an oxidized polysilicon layer, the quality of the gate oxide layer may be degraded.

SUMMARY OF THE INVENTION

An exemplary embodiment of the present invention provides a method of fabricating a semiconductor device having a metal gate pattern. A metal gate material layer may be deposited on a substrate, e.g., a silicon substrate, with a metal gate pattern then being formed using a dry etching process. The dry etching used to form the metal gate layer may damage the exposed surface of the silicon layer and the edges of the metal gate layer. The metal gate pattern may be formed of layers, e.g., sequential layers, of a gate insulating layer (e.g., a gate oxide layer), a first conductive layer (e.g., a polysilicon layer), a second conductive layer (e.g., a tungsten nitride layer), a third conductive layer (a tungsten layer), and a gate mask layer (e.g., an insulating silicon nitride layer).

The gate insulating layer may be formed of one or more insulating materials including $SiO_2$, SiON, SiN, $HfO_x$, $ZrO_x$ and $HfAlO_x$, metal oxide, metal silicate, and other high k-dielectric materials. The second conductive layer and the third conductive layer may be formed of a metal layer that includes at least one material that has a low resistance. Suitable examples of such low resistance materials include W, Ni, Co, TaN, Ru—Ta, TiN, Ni—Ti, Ti—Al—N, Zr, Hf, Ti, Ta, Mo, MoN, WN, Ta—Pt and Ta—Ti.

A first capping layer may then be formed on the surface of the substrate and the metal gate pattern. The first capping layer may be formed to a thickness of approximately 500 Å or less and a second capping layer may be deposited on the first capping layer. Suitable examples of the first and second capping layers include $SiO_x$, $SiN_x$ and SiON. When a silicon oxide layer is deposited as the first capping layer, the oxidation of the metal layers in the metal gate oxide layer may be reduced.

Spacers may be formed on sidewalls of the metal gate pattern after the formation of the capping layer(s). After the formation of the first capping layer, the first capping layer may be etched, e.g., anisotropically etched, to form first capping spacers on the sidewalls of the metal gate pattern. If a second capping layer is present on the first capping layer, the second capping layer may be etched initially, e.g., anisotropically etched, to form second capping spacers.

Selective oxidation may be performed to reduce the damage to the exposed surface of the silicon substrate and edges of the metal gate pattern caused by the dry etching process conducted when forming the metal gate pattern. The selective oxidation may be a wet oxidation process using a partial pressure of $H_2O$ and $H_2$. In addition, the selective oxidation may be performed in an $H_2$-rich atmosphere. The selective oxidation may reduce the oxidation of the second conductive layer (e.g., tungsten nitride layer) and the third conductive layer (e.g., tungsten layer) in the metal gate pattern and may selectively oxidize the surface of the silicon substrate and the first conductive layer (e.g., a polysilicon layer). In addition, the capping layer may reduce the diffusion of oxidants during selective oxidation. As a result, damage to the edges of the gate pattern may be reduced and the occurrence of punch-through of the gate insulating layer may be lowered.

In accordance with an aspect of the present invention, there is provided a method of fabricating a semiconductor device with a metal gate pattern, comprising forming a gate insulating layer on a silicon substrate and then depositing a metal gate material layer including at least a metal layer on a silicon substrate where the gate insulating layer is formed. Next, the metal gate material layer is etched so as to form a metal gate pattern. A capping layer is then formed on the metal gate pattern. Selective oxidation is carried out to cure damages caused by the etching process for forming the metal gate pattern. Thus, the oxidation of the metal layer included in the metal gate pattern is prevented and a material containing silicon is selectively oxidized.

Forming the silicon oxide layer on the entire surface of the semiconductor substrate where the metal gate pattern is formed, such that the metal layer included in the metal gate pattern is not oxidized, may comprise loading the silicon substrate where the metal gate pattern is formed into a reaction chamber in which a deposition process can be carried out. Next, a gas containing $N_2$ capable of decomposing at a low temperature is injected into the reaction chamber to create an $N_2$ atmosphere. A silicon source gas and an oxygen gas are injected into the reaction chamber so as to deposit the silicon oxide layer on the metal gate pattern.

The gas used to form the nitrogen atmosphere gas will typically not contain any oxygen and is preferably ammonia ($NH_3$). The silicon source gas may be one or more silicon-containing gases such as $SiH_4$, $Si_2H_6$, DCS (Dichlorosilane), TCS (Trichlorosilane) or HCD (Hexachlorodisilane). The oxygen source gas may include one or more gases including nitrogen, such as $N_2O$ or NO, and/or gases that do not contain nitrogen, such as $O_2$.

Meanwhile, the silicon source gas may be injected before or at the same time as the oxygen source gas. The injection of the nitrogen atmosphere gas may be stopped after or at the same time as the injection of the oxygen source gas. Alternatively, the injection of the nitrogen atmosphere gas may be stopped before the injection of the silicon source gas or the oxygen source gas.

Meanwhile, the silicon oxide layer may be deposited under a low pressure of 0.01 to 500 Torr. To set the process pressure within the range of 0.01 to 500 Torr, a pumping rate of an exhausting pump and flow rates of process gases, such as the silicon source gas and the oxygen source gas, can be properly adjusted.

Also, the silicon oxide layer may be deposited at a high temperature of 500° C. or higher using thermal chemical vapor deposition (thermal CVD). As long as flow rates of process gases are greatly reduced to slow down a deposition rate, the silicon oxide layer may be deposited by plasma enhanced CVD (PECVD) using a remote plasma.

Forming the capping layer may further comprise forming silicon oxide spacers on sidewalls of the metal gate pattern by anisotropically etching the silicon oxide layer after depositing the silicon oxide layer. Forming the capping layer may further comprise depositing a silicon nitride layer on the entire surface of the silicon oxide layer after depositing the silicon oxide layer. Forming the capping layer may further comprise forming silicon nitride spacers on the silicon oxide layer formed on the sidewalls of the metal gate pattern by anisotropically etching the silicon nitride layer after depositing the silicon nitride layer. Also, forming the capping layer may comprise forming a silicon nitride layer on the entire surface of the semiconductor substrate where the metal gate pattern is formed such that the metal layer included in the metal gate pattern is not oxidized.

According to the present invention, a capping layer is further deposited on a metal gate pattern, before applying selective oxidation, which is a reoxidation process required for a semiconductor device with the metal gate pattern including a metal layer. Thus, the capping layer can suppress diffusion of oxidants during the selective oxidation. As a result, while damages caused on edges of the gate pattern during the etching process for forming the metal gate pattern can be cured, a punch-through of the gate insulating layer can be prevented.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF EXEMPLARY EMBODIMENTS

Figure 1:
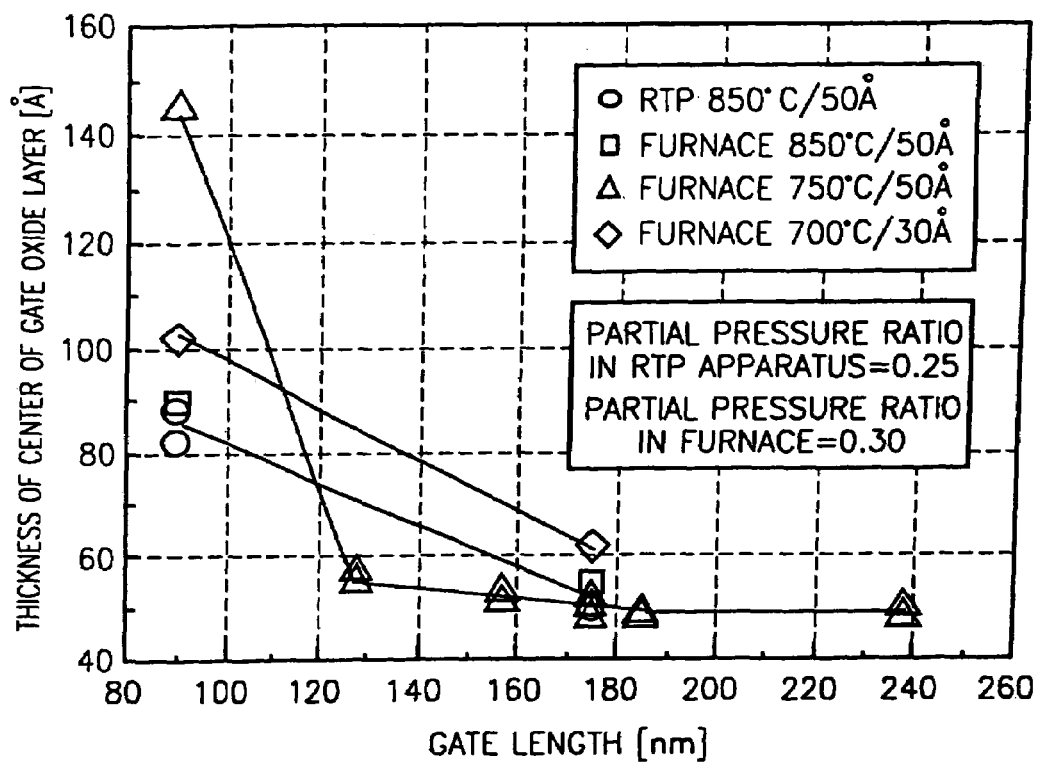
FIG. 1 is a graph illustrating the thickness of a gate oxide layer with respect to the gate length after a conventional selective oxidation process.
Figure 2A:
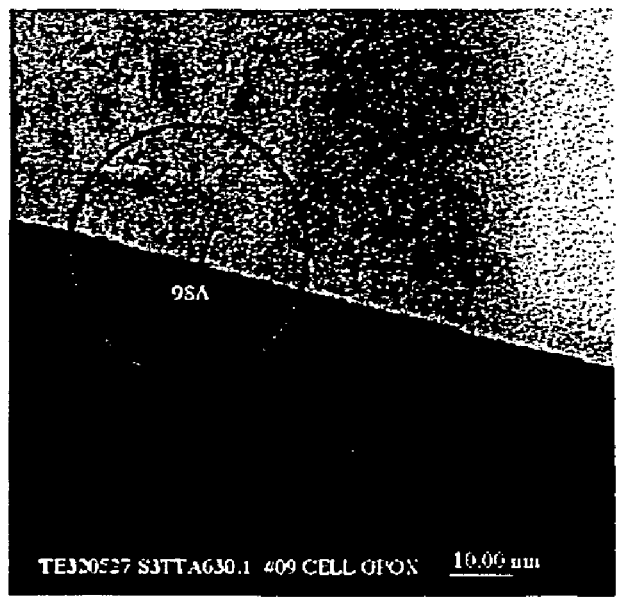
FIG. 2A is a photograph illustrating the thickness of a gate oxide layer at the edge of a gate pattern after a conventional selective oxidation process had been performed.
Figure 2B:
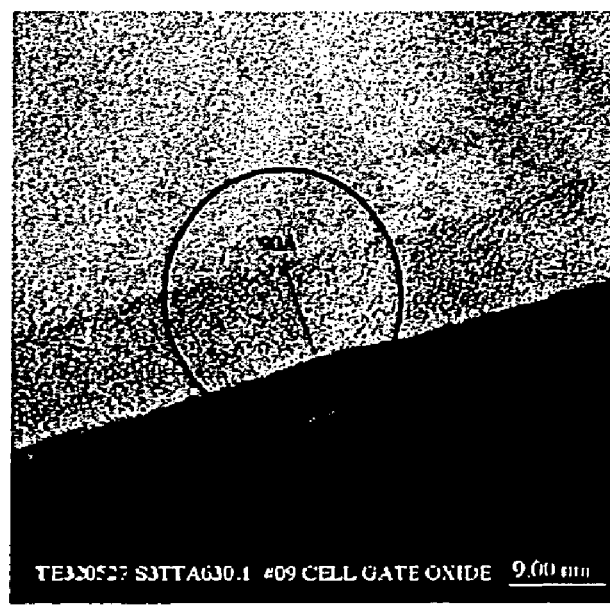
FIG. 2B is a photograph illustrating the thickness of the center of the gate oxide layer shown in FIG. 2A.

Exemplary embodiments of the present invention will now be described more fully with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure is thorough and complete and fully conveys the concept of the invention to those skilled in the art. In the drawings, the shape of the elements may be exaggerated for clarity, and the same reference numerals in different drawings represent the same elements.

Further, it will be understood that when a layer is referred to as being "on" another layer or substrate, it can be located directly on the other layer or substrate, or intervening layers may also be present. It will also be understood that when a layer is referred to as being "directly on" another layer or substrate, intervening layers are not present. It is to be further understood that when two steps are referred to as occurring at substantially the same time, the two steps may occur at the same time or at substantially the same time.

Figure 3:
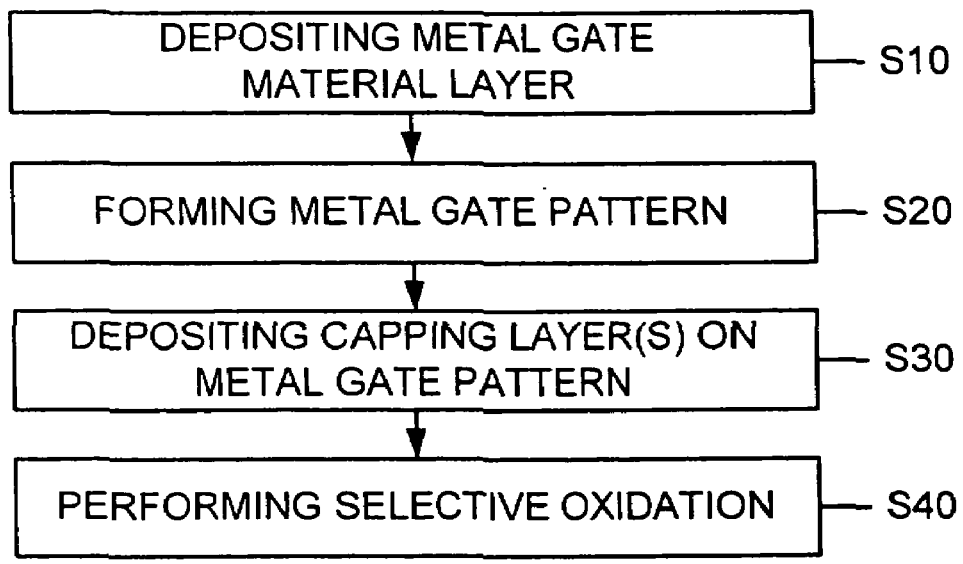
FIG. 3 is a flowchart illustrating a method of fabricating a semiconductor device having a metal gate pattern according to at least one exemplary embodiment of the present invention.
Figure 5:
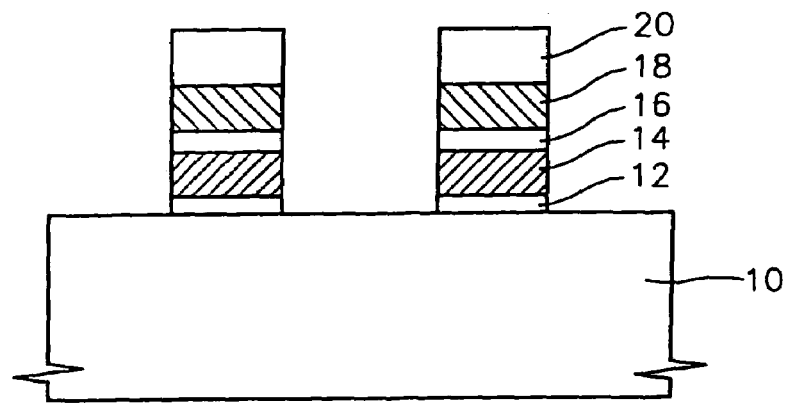
FIG. 5 is a cross-sectional view illustrating an example of a metal gate pattern according to an exemplary embodiment of the present invention.
Figure 6:
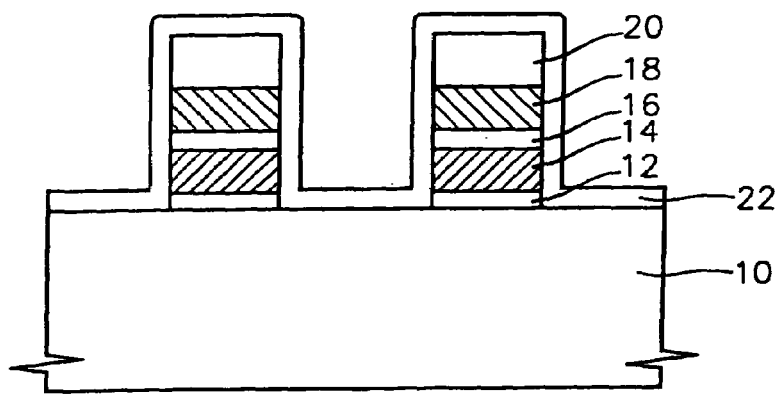
FIG. 6 is a cross-sectional view illustrating a first capping layer on the metal gate pattern illustrated in FIG. 5 according to at least one exemplary embodiment of the present invention.

FIG. 3 is a flowchart illustrating a method of fabricating a semiconductor device having a metal gate pattern according to at least one exemplary embodiment of the present invention. FIGS. 5 and 6 are cross-sectional views illustrating a method of fabricating a semiconductor device according to at least one exemplary embodiment of the present invention.

Referring to FIG. 3, in step S10, a metal gate material layer which includes at least one metal layer having a low resistance may be first deposited on a substrate. The substrate may be any suitable substrate, such as a silicon substrate formed of single crystal silicon. In step S20, a metal gate pattern may then be formed from the metal gate material layer by a conventional etching process, e.g., a dry etching process using in combination with a photolithographic process. When the metal gate pattern is formed using a dry etching process, damage will typically be sustained on the exposed surface of the silicon substrate and at the edges of the metal gate pattern.

Various metal gate patterns which include at least one metal layer can be used in the exemplary methods of the present invention. Suitable examples of the metal gate pattern include a stack of a gate mask/tungsten/tungsten nitride/polysilicon/gate oxide layer, a metal/barrier metal/polysilicon/gate insulating layer, a metal/polysilicon/gate insulating layer, a metal/barrier metal/gate insulating layer, and a metal/gate insulating layer. Each of these metal gate patterns may also include an insulating gate mask layer formed of silicon nitride.

In addition, the metal gate pattern may be a polysilicon layer formed on a gate insulating layer. If the metal gate pattern is formed on a silicon substrate, the surface of the silicon substrate may be oxidized during a reoxidation process, which may correct the damage at edges of the gate pattern. Accordingly, the present invention may also be applied to a metal gate pattern obtained by forming a metal layer directly on a gate insulating layer.

An example of a metal gate pattern according to at least one exemplary embodiment of the present invention is illustrated in FIG. 5. In this exemplary embodiment, the metal gate pattern is formed of layers, e.g., sequential layers, of a gate insulating layer 12 (e.g., a gate oxide layer), a first conductive layer 14 (e.g., a polysilicon layer), a second conductive layer 16 (e.g., a tungsten nitride layer), a third conductive layer 18 (a tungsten layer), and a gate mask layer 20 (e.g., an insulating silicon nitride layer) on a substrate 10. The gate insulating layer 12 may be formed from $SiO_2$, SiON, SiN, $HfO_x$, $ZrO_x$, and $HfAlO_x$, metal oxide, metal silicate, or other suitable high k-dielectric materials. The second conductive layer 16 and the third conductive layer 18 may be formed from a metal layer that includes at least one material that has low resistivity. Suitable examples of such low resistivity materials include, but are not limited to, W, Ni, Co, TaN, Ru—Ta, TiN, Ni—Ti, Ti—Al—N, Zr, Hf, Ti, Ta, Mo, MoN, WN, Ta—Pt, and Ta—Ti. In addition, the materials and the thickness of the layers and the processes may be varied depending on the deposition conditions, such as the type of the reaction chamber, the pressure, temperature, energy, duration, flowrates and the specific process gases used and the sequence in which they are introduced to the reaction chamber. Further, the thickness of the metal layer may vary according to the metal and materials used.

Figure 8:
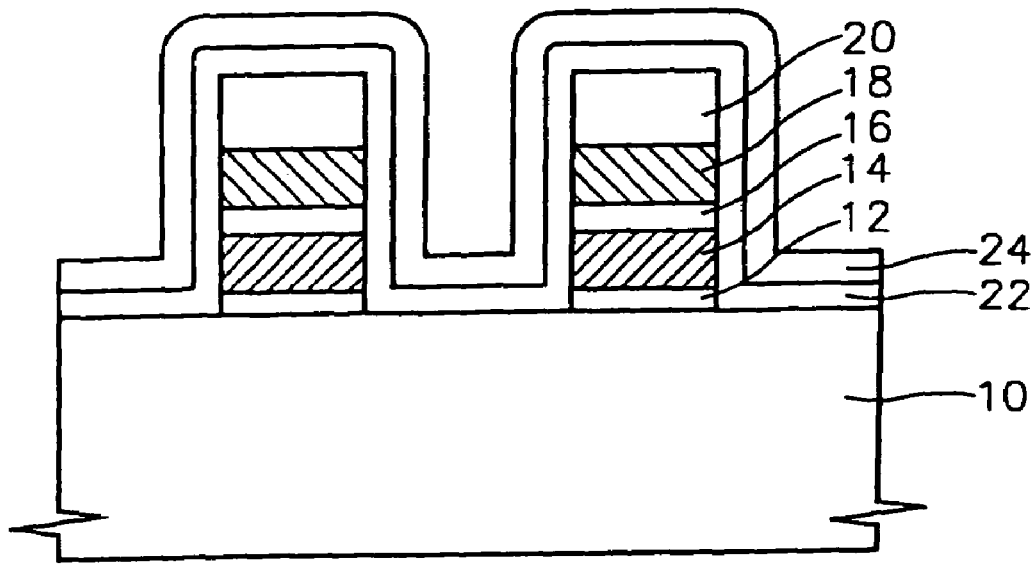
FIG. 8 is a cross-sectional view illustrating a first and a second capping layer formed on the metal gate pattern illustrated in FIG. 5 according to at least one exemplary embodiment of the present invention.

In step S30, a first capping layer 22 may then be deposited on the surface of the silicon substrate 10 and the metal gate pattern 30 (see FIG. 6). The first capping layer 22 will typically be formed to a thickness of about 500 Å or less. In at least one exemplary embodiment of the present invention, the first capping layer has a thickness of approximately 100 Å. A second capping layer 24 of similar thickness may be deposited on the first capping layer 22 (see FIG. 8). Suitable examples of the first and second capping layers 22, 24 include, but are not limited to, $SiO_x$, $SiN_x$ and SiON. In at least one exemplary embodiment of the invention, the first capping layer 22 is formed of a silicon oxide layer and the second capping layer 24 is formed of a silicon nitride layer.

When a silicon oxide layer is deposited as the first capping layer 22 on the metal gate pattern 30, the oxidation of the metal layers included in the metal gate pattern (e.g., a tungsten or a tungsten nitride layer) may be reduced. Thus, the capping layer 22 may be capable of lowering the amount of oxidants diffused during an oxidation process performed on a metal gate pattern without oxidizing the metal layers included in the metal gate pattern. As a result, damage to the edges of the metal gate pattern caused by the oxidation process may be reduced. In addition, the oxidation of a gate insulating layer of the metal gate pattern may be reduced which may lower the occurrence of punch-through in the gate insulating layer. Consequently, more reliable semiconductor devices may be fabricated through the use of one or more capping layers.

Further, according exemplary embodiments of the present invention, the surface of a metal layer, which may be exposed to a deposition atmosphere during the formation of a capping layer, is not oxidized. Thus, both the resistance of the metal layer and the vertical profile of the gate line may be maintained during subsequent oxidation processes.

In step S40, selective oxidation may be performed to correct damage to the exposed surface of the silicon substrate 10 and edges of the metal gate pattern 30 caused by the dry etching process conducted when forming the metal gate pattern 30. The selective oxidation may be a wet oxidation process using a partial pressure of $H_2O$ and $H_2$ or may be performed in an $H_2$-rich atmosphere. The selective oxidation may reduce the oxidation of the second conductive layer 16 (e.g., tungsten nitride layer) and the third conductive layer 18 (e.g., tungsten layer) in the metal gate pattern and may selectively oxidize the surface of the silicon substrate 10 and the first conductive layer 14 (e.g., a polysilicon layer).

Subsequent processes for fabricating semiconductor devices may then be performed. For example, impurity ions may be implanted into the substrate 10 by using the metal gate pattern 30 as an ion implantation mask, thereby forming an impurity region, e.g., a lightly doped region.

Figure 4:
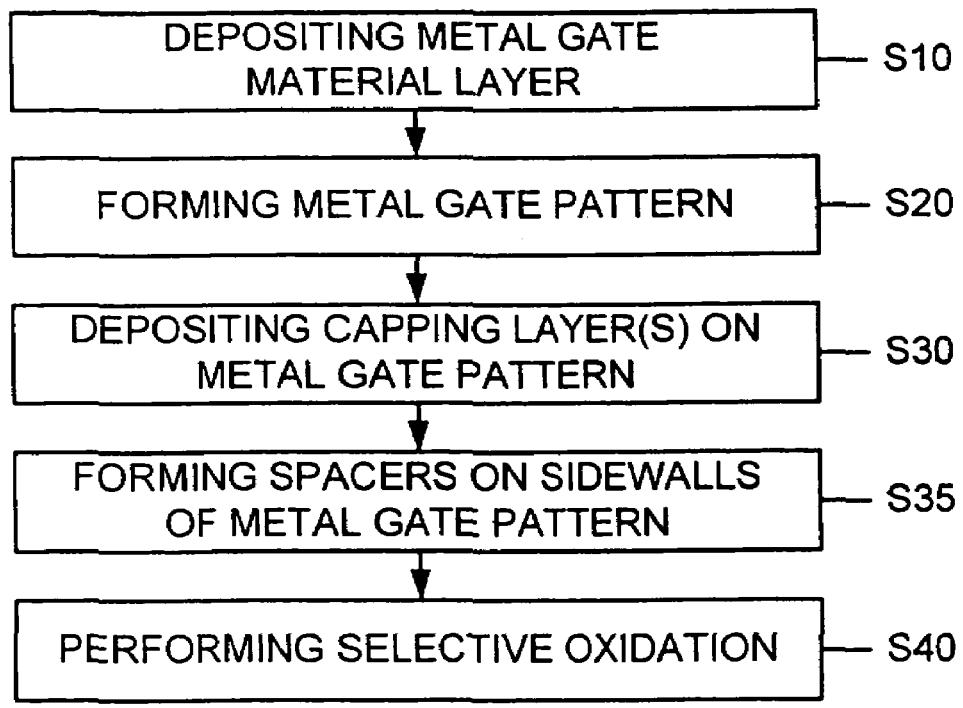
FIG. 4 is a flowchart illustrating a method of fabricating a semiconductor device having a metal gate pattern according to at least one other exemplary embodiment of the present invention.

FIG. 4 is a flowchart illustrating a method of fabricating a semiconductor device having a metal gate pattern according to at least one exemplary embodiment of the present invention. Steps S10-S30 are conducted in the same manner as described above with reference to FIG. 3.

Figure 7:
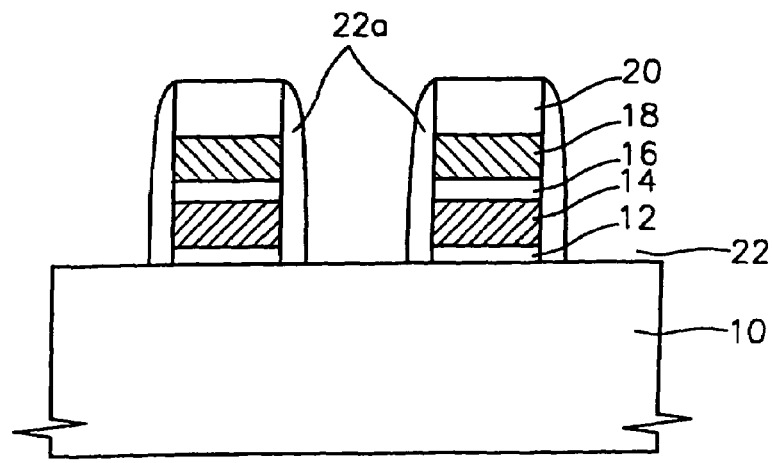
FIG. 7 is a cross-sectional view illustrating first capping spacers formed on the metal gate pattern illustrated in FIG. 5 according to at least one exemplary embodiment of the present invention.
Figure 9:
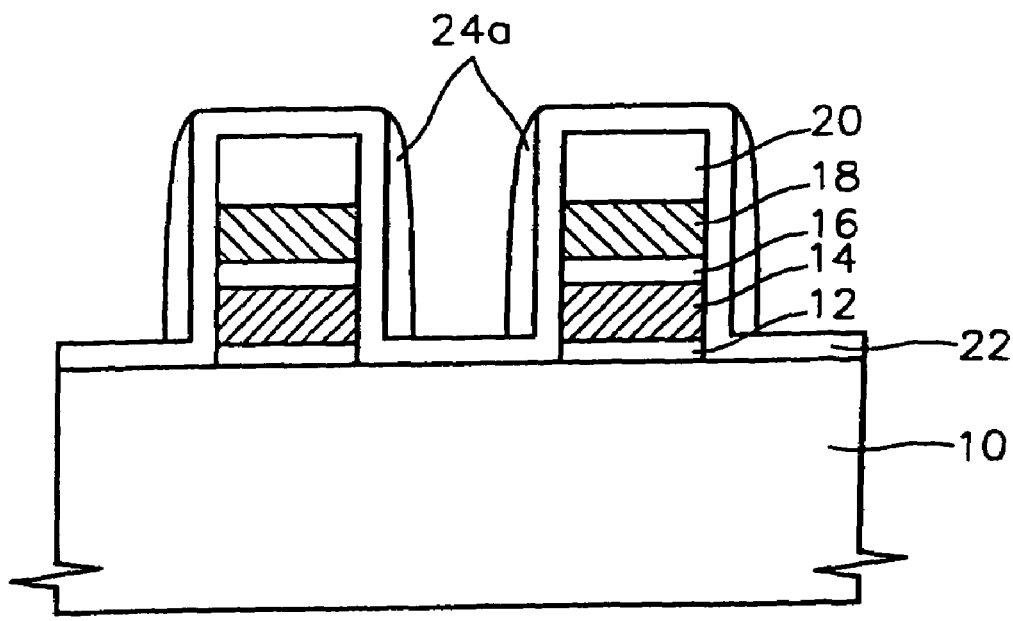
FIG. 9 is a cross-sectional view illustrating second capping spacers formed on a first capping layer according to at least one exemplary embodiment of the present invention.

In step S35, spacers may be formed on the sidewalls of the metal gate pattern 30 after the formation of the capping layer(s). For example, after depositing the first capping layer 22, the capping layer 22 may be etched, e.g., anisotropically etched, to form first capping spacers 22a on the sidewalls of the metal gate pattern 30 (see FIG. 7). If a second capping layer 24 is present on the first capping layer 22, the second capping layer 24 may be etched, e.g., anisotropically etched, to form second capping spacers 24a as illustrated in FIG. 9. Once the spacers, e.g., first capping spacers 22 and/or second capping spacers 24, are formed, in step S40, selective oxidation may be performed as described above to selectively oxidize the substrate 10 and the first conductive layer 14.

An exemplary embodiment of the present invention in which a silicon oxide layer (e.g., a capping layer) is formed on a metal gate pattern with a reduction in the amount of oxidation of the surfaces of the metal layers, e.g., the second conductive layer 16 (tungsten nitride layer) and the third conductive layer 18 (tungsten layer) will now be described in detail.

The substrate 10, including the metal gate pattern 30, may be loaded into a reaction chamber in which a deposition process, e.g., a chemical vapor deposition (CVD) process, may be performed. Suitable types of CVD processes include plasma enhanced CVD (PE-CVD), high density plasma CVD (HDP-CVD), thermal CVD, laser CVD, and hot filament CVD (HF-CVD). Exemplary embodiments of the present invention may be applied to processes with plasma by reducing the flow rates of the process gases or by reducing the deposition speed using a remote plasma source.

When a PE-CVD process is used, the silicon oxide layer may be formed at a temperature of from approximately 400° C. to approximately 500° C. At these temperatures, an oxygen gas used to form the silicon oxide layer may not decompose and the metal layers may not be oxidized. In addition, the silicon source gas may be supplied at substantially the same time as igniting the plasma to form the silicon oxide. Thus, the silicon may react with the oxygen to deposit the silicon oxide layer with a reduction in the oxidation of the metal layers.

The silicon oxide layer may also be formed using a PE-CVD process at a temperature of approximately 750° C. If the oxygen source gas and the silicon source gas are substantially injected at substantially the same time, the silicon oxide layer may be deposited with a reduction in the oxidation of the metal layers.

The silicon oxide layer may be formed using a low pressure CVD process at a temperature of approximately 750° C. The silicon source gas may be supplied just before the oxygen source gas to deposit silicon oxide layer with a reduction in the oxidation of the metal layers.

The reaction chamber of the present embodiment is preferably one of a single-wafer-type chamber and a batch-type chamber. Experimental conditions may vary depending on the types of equipment used, and these experimental conditions would be easily determined and adjusted by one of skill in the art. Although a CVD process in a single wafer type reaction chamber is described herein, a furnace having a large capacity and the ability to control the pressure, temperature, and flow rates of gases entering into the furnace may alternatively be used.

Next, the reaction chamber may be maintained in a nitrogen atmosphere. In order to maintain a nitrogen atmosphere, a nitrogen source gas, e.g., a gas that includes at least nitrogen, may be supplied to the reaction chamber, e.g., at a constant flow rate, for a period of time. The nitrogen atmosphere gas may decompose at a low temperature and may be a compound that does not include oxygen. The absence of oxygen may reduce the oxidation of the metal layer, and, as a result, the oxidation of metal layers present in the gate electrode (e.g., a tungsten layer) may be reduced or eliminated. In at least one exemplary embodiment of the present invention, an ammonia ($NH_3$) gas may be used as the nitrogen source gas. Other suitable nitrogen source gases would be easily identified by those of skill in the art.

A silicon source gas and/or an oxygen source gas may then be supplied to the reaction chamber in the nitrogen atmosphere to form a silicon oxide layer (e.g., capping layer 22) on the metal gate pattern 30. Suitable silicon source gases include, but are not limited to, $SiH_4$, $Si_2H_6$, DCS (dichlorosilane), TCS (trichlorosilane), and HCD (hexachlorodisilane). Suitable oxygen source gases include, but are not limited to, $N_2O$, NO, and $O_2$. In one exemplary embodiment of the present invention, a silane gas ($SiH_4$) may be used as the silicon source gas and oxygen may be used as the oxygen source gas.

A silicon nitride layer (e.g., the second capping layer 24), may be formed on the silicon oxide layer (e.g., first capping layer 22) by performing a general CVD process. As described above, suitable types of CVD processes include plasma enhanced CVD (PE-CVD), high density plasma CVD (HDP-CVD), thermal CVD, laser CVD, and hot filament CVD (HF-CVD).

A process for establishing and maintaining a nitrogen atmosphere in the reaction chamber and forming the silicon oxide layer (e.g., capping layer 23) on the metal gate pattern 30 by supplying a silicon source gas and an oxygen source gas will now be described.

As discussed above, a nitrogen source gas, e.g., ammonia, may be supplied to the reaction chamber to establish a nitrogen atmosphere within the reaction chamber. The supply of the nitrogen source gas may be stopped after or at substantially the same time as the supply of the oxygen gas into the reaction chamber is initiated. Alternatively, the supply of the nitrogen source gas may be stopped before the oxygen source gas is supplied to the reaction chamber. The introduction of the silicon source gas into the reaction chamber may be initiated either before or at substantially the same time as the oxygen source gas is introduced. Other suitable sequences for the supply of the functional gases to the reaction chamber may be easily determined by one of skill in the art.

Experimental conditions and parameters in methods according to exemplary embodiments of the present invention may vary according to the type and the size of reaction chambers, and the types and the pressures of the process gases. For example, when the reaction chamber is a single-wafer-type chamber, the temperature may range from approximately 500 to approximately 850° C., the pressure may range from approximately 100 to approximately 300 Torr, the flow rate of the nitrogen source gas may range from approximately 50 to approximately 500 sccm, the flow rate of the silicon source gas may range from approximately 1 to approximately 10 sccm, and the flow rate of the oxygen source gas may range from approximately 500 to approximately 5000 sccm. In another exemplary embodiment, the temperature may range from approximately 500 to approximately 850° C., the pressure may range from approximately 0.1 to approximately 3 Torr; the flow rate of the nitrogen source gas may range from approximately 50 to approximately 1000 sccm, the flow rate of the silicon source gas may range from approximately 1 to approximately 50 sccm, and the flow rate of the nitrogen source gas may range from approximately 50 to approximately 1000 sccm.

When the reaction chamber is a batch-type chamber, the temperature may range from approximately 500 to approximately 850° C., the pressure may range from approximately 0.1 to approximately 2 Torr, the flow rate of the nitrogen source gas may range from approximately 50 to approximately 1000 sccm, the flow rate of the silicon source gas may range from approximately 5 to approximately 200 sccm, and the flow rate of the oxygen source gas may range from approximately 50 to approximately 1000 sccm.

If the supply of the nitrogen source gas is stopped before the oxygen source gas is supplied to the reaction chamber, the time period between the termination of the nitrogen source gas supply and the initial introduction of the oxygen source gas is preferably brief so that the nitrogen atmosphere in the reaction chamber is substantially maintained. This allows the silicon source gas and the oxygen source gas to be introduced into the reaction chamber under a nitrogen atmosphere.

Figure 10:
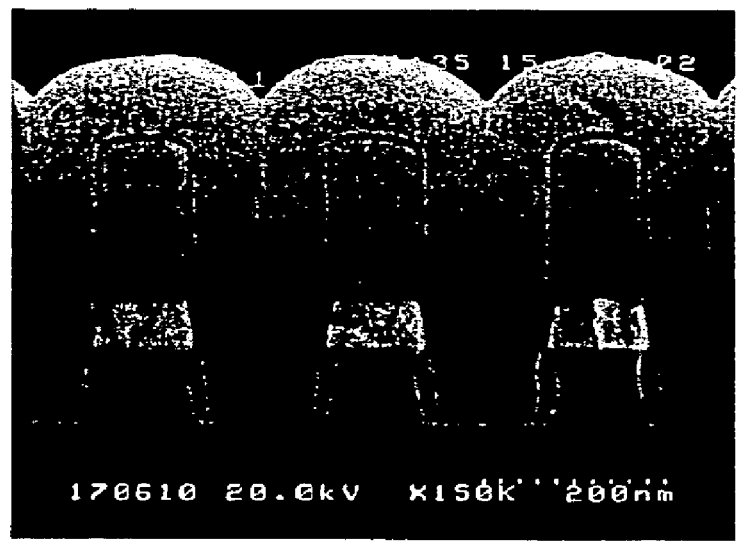
FIG. 10 is a photograph illustrating a cross-section of a cell region of a semiconductor device according to at least one exemplary embodiment of the present invention.
Figure 11:
FIG. 11 is a photograph illustrating a cross-section of a peripheral region of a semiconductor device according to at least one exemplary embodiment of the present invention.

FIGS. 10 and 11 are scanning electron microscope (SEM) photographs illustrating semiconductor devices fabricated according to exemplary embodiments of the present invention. FIG. 9 is a photograph of a cross-section of a cell region of semiconductor device in which metal gate patterns are positioned in close proximity to each other and the gate length is small. FIG. 10 is a photograph of a cross-section of a peripheral region of a semiconductor device in which metal gate patterns are not located close to each other and the gate length is large.

Referring to FIGS. 10 and 11, in both cases, selective oxidation was conducted after a silicon oxide layer was formed on a metal gate pattern according to exemplary embodiments of the present invention. A polysilicon layer may be formed to a certain thickness (e.g., a thick layer) on the surface (e.g., the entire surface) of the silicon substrate and the silicon substrate may be vertically sectioned. The sectioned silicon substrate may then be HF-processed. After HF-processing, the silicon oxide layer may be selectively etched at a faster rate than the polysilicon or other material layers of the metal gate pattern. After forming a silicon oxide layer as the capping layer to a thickness of about 100 Å, even if the selective oxidation is carried out, while the tungsten layer 18 and the tungsten nitride layer 16 are not oxidized, only the silicon substrate 10 and polysilicon layer 14 are oxidized. In FIGS. 10 and 11, dark lines along the gate line pattern depict the deposited silicon oxide layer and the oxidized silicon substrate and polysilicon layer. Thus, the silicon substrate and the polysilicon layer may be selectively oxidized with a reduction in the oxidation of the metal layers the metal gate pattern.

Figure 12A:
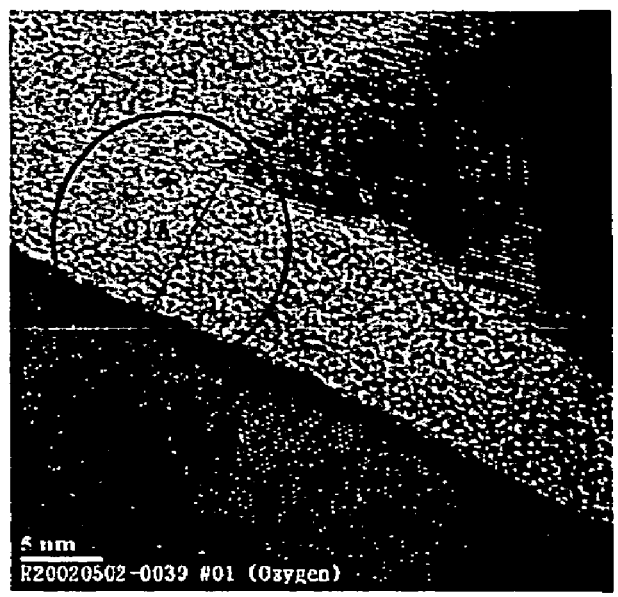
FIG. 12A is a photograph illustrating the thickness of a gate oxide layer at the edges of a gate pattern according to at least one exemplary embodiment of the present invention.
Figure 12B:
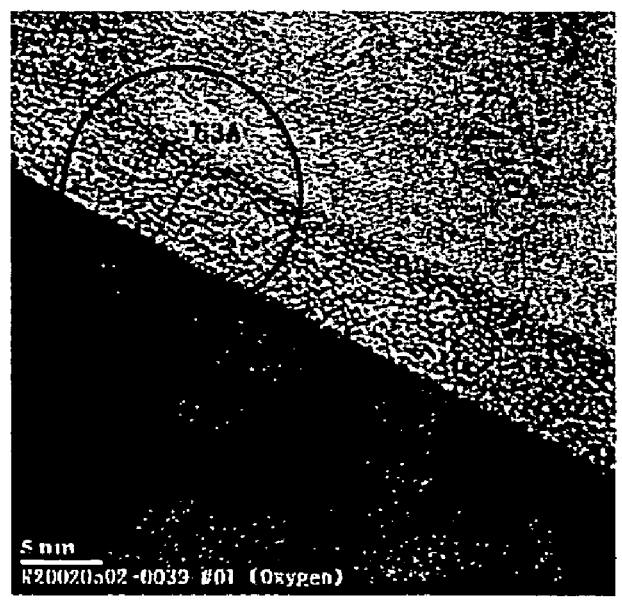
FIG. 12B is a photograph illustrating the thickness of the center of the gate oxide layer shown in FIG. 12A.

Hereinafter, the effect of the exemplary methods for curing or reducing etch damage caused at the edges of the metal gate pattern and reducing or eliminating punch-through defects in the gate insulating layer will be described. FIGS. 12A and 12B are photographs illustrating the thickness of a gate oxide layer formed at edges and the center, respectively, of a gate according to exemplary embodiments of the present invention. That is, a silicon oxide layer is formed as a capping layer to the thickness of 100 Å on the metal gate pattern having the gate length of 90 nm.

As shown in FIG. 12A, the gate oxide layer has the thickness of 91 Å at the edges of the gate pattern, and as shown in FIG. 12B, the gate oxide layer has the thickness of 63 Å at the center of the gate pattern. As compared with FIGS. 11A and 11B, the gate pattern is oxidized to the same extent enough to cure etching damages at the edges of the gate pattern. However, the thickness of the gate oxide layer is increased by only 10 Å or less at the center of the gate pattern, thus illustrating that punch-through of the gate oxide layer may be reduced.

While the invention has been particularly shown and described with reference to exemplary embodiments thereof, it should be understood by those skilled in the art that various changes in form and details may be made therein without departing from the spirit and scope of the invention as defined by the appended claims.

What is claimed is:

1. A method of fabricating a semiconductor device having a metal
gate pattern,
the method comprising:
forming a gate insulating layer having an initial thickness on a silicon substrate;
forming a metal gate pattern including at least one metal layer;
forming a capping layer on the metal gate pattern, including forming a silicon oxide layer on a surface of the semiconductor substrate and a top surface and sidewalls of the metal gate pattern, the silicon oxide layer being formed under conditions such that the at least one metal layer remains substantially unoxidized;
patterning the capping layer to form spacers on the metal gate pattern; and
selectively oxidizing at least a portion of the silicon substrate without substantially oxidizing the at least one metal layer,
wherein an edge portion of the gate insulating layer is thicker than a center portion of the gate insulating layer.

2. The method of fabricating a semiconductor device having a
metal gate pattern according to claim 1, wherein in the step of selectively oxidizing at least a portion of the silicon substrate does not substantially increase the initial thickness of the center portion of the gate insulating layer.

3. The method of fabricating a semiconductor device having a metal gate pattern according to claim 1, wherein:
the metal gate material includes a polysilicon layer; and
selectively oxidizing at least a portion of the silicon substrate also oxides a portion of the polysilicon layer.

4. The method of fabricating a semiconductor device having a metal gate pattern according to claim 1, wherein:
the gate insulating layer includes at least one insulating material layer selected from the group consisting of silicon oxide, silicon oxynitride, silicon nitride, metal oxides and metal silicates.

5. The method of fabricating a semiconductor device having a metal gate pattern according to claim 1, wherein:
the metal layer is selected from the group consisting of W, Ni, Co, TaN, Ru—Ta, TiN, Ni—Ti, Ti—Al—N, Zr, Hf, Ti, Ta, Mo, MoN, WN, Ta—Pt and Ta—Ti.

6. The method of fabricating a semiconductor device having a metal gate pattern according to claim 1, wherein: the metal gate pattern has a stacked structure selected from the group consisting of a metal/barrier metal/polysilicon/gate insulator stack, a metal/polysilicon/gate insulator stack, a metal/barrier metal/gate insulator stack and a metal/gate insulator stack.

7. The method as claimed in claim 1, wherein:
the metal gate pattern is formed of a gate mask/tungsten/tungsten nitride/polysilicon/gate insulator stack.

8. The method of fabricating a semiconductor device having a metal gate pattern according to claim 1, wherein:
the silicon oxide layer included in the capping layer has a thickness of not more than about 500 Å.

9. The method of fabricating a semiconductor device having a metal gate pattern according to claim 1, wherein:
forming the silicon oxide layer includes:
loading the silicon substrate on which the metal gate pattern is formed into a reaction chamber;
injecting a nitrogen source gas into the reaction chamber, the conditions in the reaction chamber being sufficient to cause the nitrogen source gas to form a nitrogen atmosphere within the reaction chamber; and
injecting a silicon source gas and an oxygen source gas into the reaction chamber under conditions sufficient to cause the silicon oxide layer to form on the metal gate pattern.

10. The method of fabricating a semiconductor device having a metal gate pattern according to claim 9, wherein:
the nitrogen atmosphere is substantially free of oxygen.

11. The method of fabricating a semiconductor device having a metal gate pattern according to claim 10, wherein:
the nitrogen source gas includes ammonia.

12. The method of fabricating a semiconductor device having a metal gate pattern according to claim 9, wherein:
the silicon source gas includes at least one source gas selected from a group consisting of $SiH_4$, $Si_2H_6$, DCS, TCS and HCD; and
the oxygen source gas includes at least one source gas selected from a group consisting of $N_2O$, NO and $O_2$.

13. The method of fabricating a semiconductor device having a metal gate pattern according to claim 9, wherein:
the injection of the silicon source gas is initiated at a time no later than the injection of the oxygen source gas is initiated.

14. The method of fabricating a semiconductor device having a metal gate pattern according to claim 9, wherein:
the injection of the nitrogen source gas into the reaction chamber is terminated under a condition selected from a group consisting of:
after the injection of the oxygen source gas has been initiated,
substantially simultaneously with the initiation of the oxygen source gas, and
before injection of the oxygen source gas or injection of the silicon source gas has been initiated.

15. The method of fabricating a semiconductor device having a metal gate pattern according to claim 9, wherein:
forming the silicon oxide layer includes a chemical vapor deposition process selected from a group consisting of plasma enhanced CVD, remote plasma enhanced CVD, high density plasma CVD, thermal CVD, laser CVD and hot filament CVD.

16. The method of fabricating a semiconductor device having a metal gate pattern according to claim 1, further comprising:
etching the silicon oxide layer to form silicon oxide spacers on the sidewalls of the metal gate pattern.

17. The method of fabricating a semiconductor device having a metal gate pattern according to claim 1, further comprising:

depositing a silicon nitride layer on the silicon oxide layer.

18. The method of fabricating a semiconductor device having a metal gate pattern according to claim 17, further comprising:

etching the silicon nitride layer to form silicon nitride spacers on the silicon oxide layer formed on the sidewalls of the metal gate pattern.

19. The method of fabricating a semiconductor device having a metal gate pattern according to claim 1, wherein:

selectively oxidizing at least a portion of the silicon substrate without substantially oxidizing the at least one metal layer uses a wet oxidation process utilizing partial pressures of $H_2O$ and $H_2$.

20. The method of fabricating a semiconductor device having a metal gate pattern according to claim 1, further comprising:

implanting impurity ions into the portion of the silicon substrate using the metal gate pattern as an ion implantation mask after the portion of the silicon substrate has been selectively oxidized.

21. The method of fabricating a semiconductor device having a metal gate pattern according to claim 3, wherein:

the metal gate pattern has a width of not more than about 100 nm;

the capping layer has a thickness of not more than about 150 Å; and the initial thickness of the gate insulating layer is increased by less than 10 Å.

* * * * *